United States Patent
Fanti et al.

(12) 
(10) Patent No.: US 6,468,413 B1
(45) Date of Patent: Oct. 22, 2002

(54) ELECTROCHEMICAL ETCH FOR HIGH TIN SOLDER BUMPS

(75) Inventors: Lisa A. Fanti, Hopewell Junction, NY (US); John Michael Cotte, New Fairfield, CT (US); David Ely Eichstadt, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 09/697,333

(22) Filed: Oct. 26, 2000

(51) Int. Cl.[7] .................................................. C25F 3/02
(52) U.S. Cl. ........................................ 205/682; 205/684
(58) Field of Search .................................. 205/682, 684

(56) References Cited

U.S. PATENT DOCUMENTS

| | | | | |
|---|---|---|---|---|
| 4,549,944 A | * | 10/1985 | Pliefte | ........................ 205/656 |
| 5,318,677 A | * | 6/1994 | Hirbour et al. | ............. 205/705 |
| 5,462,638 A | | 10/1995 | Datta et al. | |
| 5,486,282 A | | 1/1996 | Datta et al. | |
| 5,800,726 A | | 9/1998 | Cotte et al. | |
| 6,015,505 A | | 1/2000 | David et al. | |

* cited by examiner

*Primary Examiner*—Donald R. Valentine
(74) *Attorney, Agent, or Firm*—Ira D. Blecker

(57) ABSTRACT

An aqueous electrochemical etchant for etching metals in the presence of one or more metals not to be etched, the etchant including glycerol in the concentration range of 1.30 to 1.70 M, a sulfate compound having a sulfate ion concentration in the range of 0 to 0.5 M, and a phosphate compound having a phosphate ion concentration in the range of 0.1 to 0.5 M.

21 Claims, 3 Drawing Sheets

ELECTROCHEMICAL ETCH FOR HIGH TIN SOLDER BUMPS

BACKGROUND OF THE INVENTION

The present invention relates to the selective etching of metals and, more particularly, relates to the electrochemical etching of metals in the presence of various solders.

C4 is an advanced microelectronic chip packaging and connection technology. "C4" stands for Controlled Collapse Chip Connection. C4 is also known as "solder bump", "solder balls" and "flip chip" and these terms may also be used in conjunction such as "C4 solder bump".

The basic idea of C4 is to connect chips (semiconductor devices), chip packages, or such other units by means of solder bumps between two surfaces of the units. These tiny bumps of electrically conductive solder bridge the gaps between respective pairs of metal pads on the units being connected. Each pad has a corresponding pad on the other unit's surface; the pad arrangements are mirror images. As the units are pressed together and heated the solder bumps on the pads of the first unit are contacted with corresponding conductive pads (having no bumps) on the second unit and reflowed, partially collapsing the solder bumps and making connections between respective pads.

In C4 the solder bumps are formed directly on the metal pads of the one unit. The pads are electrically isolated from other components by the insulating substrate that surrounds each pad. The substrate might be silicon (Si) or some other material. The bottom of the pad is electrically connected into the chip circuit. major application of C4 is in joining chips to a carrier or package. Chips usually are made in rectangular arrays on a monocrystalline slab of silicon, called a "wafer". Many chips are formed on each wafer, and then the wafer is broken up into individual chips and the chips are "packaged" in units large enough to be handled. The C4 bumps are placed on the chips while they are still joined in a wafer.

The wafers are made as large as possible so as to reduce the number of wafers that must be processed to make a certain number of chips. For the same reason (among others) the chips are made as small as possible. Thus, the best C4 fabrication system is one that can make thousands of very small, closely-spaced solder bumps each precisely placed over a large area.

C4 solder bumps must be mechanically well-fastened to their pads, or they may be torn off when the two surfaces are pushed together. It will be appreciated that a complex device such as a computer may have dozens of chips and hundreds or thousands of C4 solder ball connections, and the entire device may be rendered useless if only one of the bumps fails. The attachment of the C4 bumps requires careful design.

One method of forming solder bumps uses sputtering or vacuum deposition. In this method, solder metal is evaporated in a vacuum chamber. The metal vapor coats everything in the chamber with a thin film of the evaporated metal. To form solder bumps on the substrate, the vapor is allowed to pass through holes in a metal mask held over the substrate. The solder vapor passing through the holes condenses onto the cool surface into solder bumps. This method requires a high vacuum chamber to hold the substrate, mask, and flash evaporator.

An alternative technique for making solder bumps is electrodeposition, also called electrochemical plating or electroplating. This method also uses a mask and forms solder bumps only at the selected sites, but the technique is very different from the evaporation method.

The first step in electrolytically forming C4 solder bumps is to deposit a continuous stack of metal films across the wafer to be bumped. This so-called "seed layer" performs a dual function. First, it provides a conductive path for current flow during the electrolytic deposition of the solder bumps. Second, it remains under the solder bumps and forms the basis for the ball limiting metallurgy (BLM) for the C4s. Therefore, it must contain at least one layer that is conductive enough to permit uniform electrodeposition across the entire expanse of the wafer. The bottom layer must adhere well to the underlying semiconductor device passivation and the top layer must interact sufficiently with the solder to form a reliable bond. In addition, the BLM may contain barrier layers which prevent the solder from detrimentally interacting with the underlying device constituents. Finally, the stresses generated by the composite stack should be low enough to sustain the reliability of the C4 joint throughout various thermal and mechanical stresses. Considering all of these factors, seed layers often consist of more than one metal layer, and these various layers must be etched away from between the C4s at some point during the processing in order to electrically isolate the interconnects.

The second step, after the seed layer is laid down, is to form a mask by photolithography. A layer of photoresist is laid onto the seed layer and exposed to light. Unexposed photoresist (if a negative photoresist) can then be washed away to leave the cured photoresist behind as a mask. The mask has rows of holes where the solder bumps are to be deposited.

The third step is electrodeposition (electroplating) of solder into the mask holes.

After the solder bumps are formed, the mask of cured photoresist is removed. The substrate now is covered with the continuous seed layer and numerous solder bumps. Then, the seed layer is removed in between the solder bumps to electrically isolate them by suitable wet etching and/or electroetching processes.

The solder typically used for the C4 solder bumps is 97 weight percent Pb and 3 weight percent Sn. A typical seed layer would comprise a TiW layer, a phased Cr/Cu layer or a Cr/Cu alloy and a Cu layer. The process utilized to simultaneously remove the Cr/Cu and Cu layers is an electroetching process which includes an aqueous solution containing glycerol and potassium sulfate as disclosed in Datta et al. U.S. Pat. No. 5,486,282, the disclosure of which is incorporated by reference herein. The glycerol serves as a wetting agent, but the purpose of the potassium sulfate is twofold. First, the potassium sulfate imparts electrolytic conductivity to the solution. Second, the free sulfate ions complex readily with the high Pb solder bumps and form a protective crust which prevents the solder bumps from being dissolved during the electroetching process. The TiW layer is then etched using a wet etching process which includes an aqueous etchant comprising hydrogen peroxide, EDTA and potassium sulfate as disclosed in Datta et al. U.S. Pat. No. 5,462,638 and Fanti et al. U.S. Pat. No. 6,015,505, the disclosures of which are incorporated by reference herein. The "crust" on the solder bumps is removed in a subsequent cleaning process.

More recent applications use a lower melting solder for the C4 bumps to enable lower temperature chip joining. Such a lower melting solder could be the lead/tin solder composition comprising 63 weight percent Sn and 37 weight percent Pb.

Cotte et al. U.S. Pat. No. 5,800,726, the disclosure of which is incorporated by reference herein, have proposed an aqueous solution for the wet etching of various metals, such as TiW, in the presence of eutectic solder. This solution comprises potassium phosphate, hydrogen peroxide, EDTA and oxalic acid.

The present inventors have recognized that the current electroetch process is not effective with respect to high Sn solder bumps. The reason is that Sn is not very reactive with sulfate ions so the prior art electroetch solution as disclosed in the above Datta et al. U.S. Pat. No. 5,486,282 does not form a protective crust over the solder bump during electroetch. The undesirable result is that a large amount of the Sn is leached out from the solder bump. In addition, the dissolved Sn is free to redeposit on the TiW and complex with the TiW so as to render the TiW layer impermeable to traditional wet etching.

The problem is further complicated by hierarchical solder structures in which, for example, a low melting, high Sn solder bump is deposited over a high melting, high Pb solder bump.

The present inventors have thus recognized a need to be able to effectively electroetch metals and not affect the solder bumps where at least a portion of the solder bump contains a high Sn solder.

Accordingly, it is a purpose of the present invention to electroetch substrates having metals to be electroetched and high Sn solder bumps which are not to be etched.

It is a further purpose of the present invention to electroetch substrates having metals to be electroetched and solder hierarchies containing high Sn solder bumps and high lead solder bumps which are not to be etched.

These and other purposes of the present invention will become more apparent from the following description considered in conjunction with the accompanying drawings.

BRIEF SUMMARY OF THE INVENTION

The purposes of the invention have been achieved by providing according to a first aspect of the invention an aqueous electrochemical etchant for etching metals in the presence of one or more metals not to be etched, the etchant comprising:

glycerol in the concentration range of 1.30 to 1.70 M;

a sulfate compound having a sulfate ion concentration in the range of 0 to 0.5 M; and a phosphate compound having a phosphate ion concentration in the range of 0.1 to 0.5 M.

According to a second aspect of the invention, there is provided a method for selectively dissolving, in an article, one or more metals to be dissolved in the presence of one or more metals not to be dissolved, the method comprising the step of:

electrochemically etching the metals to be dissolved with an aqueous etchant comprising glycerol in the concentration range of 1.30 to 1.70 M, a sulfate compound having a sulfate ion concentration in the range of 0 to 0.5 M, and a phosphate compound having a phosphate ion concentration in the range of 0.1 to 0.5 M.

According to a third aspect of the invention, there is provided a method for selectively etching an article, the method comprising the steps of:

providing an article having one or more metals to be dissolved in the presence of one or more metals not to be dissolved; and electrochemically etching the one or more metals to be dissolved with an aqueous etchant comprising glycerol in the concentration range of 1.30 to 1.70 M, a sulfate compound having a sulfate ion concentration in the range of 0 to 0.5 M, and a phosphate compound having a phosphate ion concentration in the range of 0.1 to 0.5 M.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1:
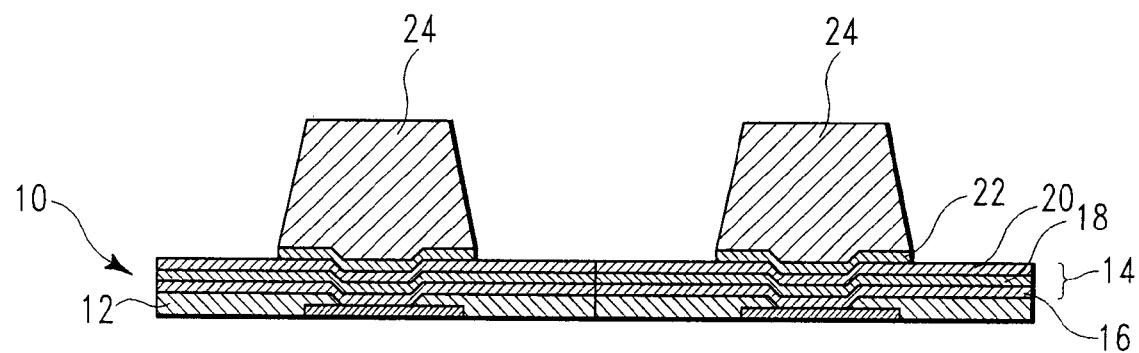
FIG. 1 is a side view of a chip showing the seed layer and a first solder hierarchy containing only a solder comprising primarily Sn.

Referring to the drawings in more detail, and particularly referring to FIG. 1, there is shown a first chip 10 comprised of semiconductor material 12, seed layer 14 and solder bumps 24. As noted earlier, the seed layer 14 is actually comprised of a plurality of layers. One typical grouping of layers, for purposes of illustration and not limitation, is first layer 16 of a TiW alloy (e.g., 10 weight percent Ti and 90 weight percent Tungsten), second layer 18 of phased Cr/Cu or a Cr/Cu alloy and third layer 20 of Cu. There may also be a barrier layer 22 of, for example, nickel.

The solder bump 24 on chip 10 comprises primarily Sn solder. Such a solder might be be of moderate Sn content such as 60 weight percent or more Sn and 40 weight percent or less Pb, or high Sn content such as 95 weight percent or greater of Sn, balance Pb. Too, the solder may include lead-free alloys comprising primarily Sn such as Sn/Ag, Sn/Cu, Sn/Ag/Cu, and Sn/Bi alloys, just to name a few.

Figure 2:
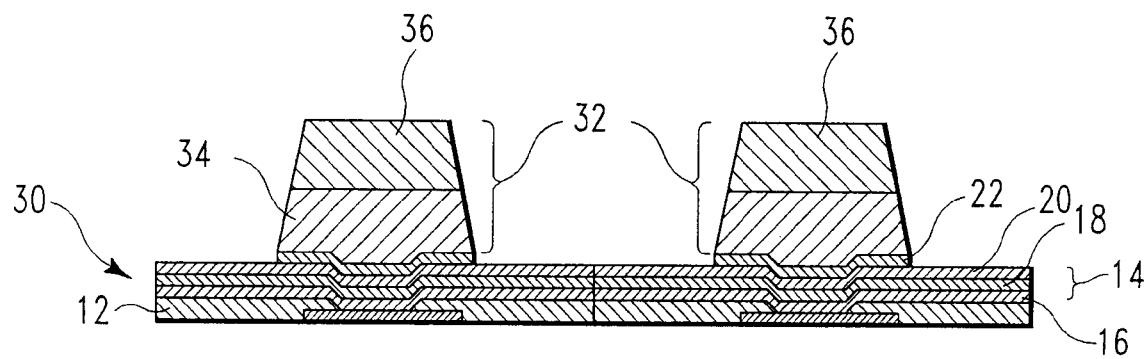
FIG. 2 is a side view of a chip showing the seed layer and a second solder hierarchy containing a high Sn solder and a high Pb solder.

Referring now to FIG. 2, there is shown a second chip 30 comprised of semiconductor material 12, seed layer 14 and solder bumps 32. Seed layer 14 could be the same as that shown in FIG. 1 or could be different, depending on the application. Similarly, second chip 30 could also have barrier layer 22. Second chip 30 contains solder bumps 32. In this case, however, solder bumps 32 comprise a solder hierarchical structure comprised of a higher melting temperature solder 34 and a lower melting temperature solder 36. There could be additional layers of solder if desired as the solder hierarchical structure shown in FIG. 2 is for purposes of illustration only.

Higher melting temperature solder 34 could be a high Pb solder having 95 to 97 weight percent Pb, remainder Sn. Lower melting solder 36 could be any of the moderate Sn content, high Sn content or lead-free alloys mentioned above.

The remainder of the discussion will center on second chip 30 but it should be understood that the present invention is equally applicable to first chip 10.

Figure 3:
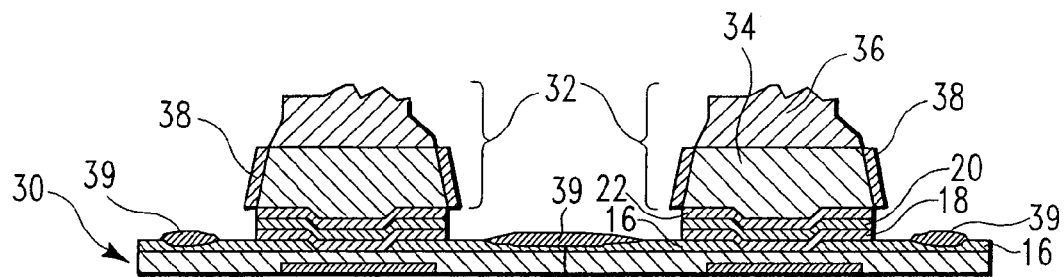
FIG. 3 is a side view of the chip in FIG. 2 after electroetching with a prior art etchant.

Referring now to FIG. 3, second chip 30 has been electroetched with a conventional aqueous etchant including glycerol and potassium sulfate. The composition of this etchant was 1.5 M glycerol and 0.35 M $K_2SO_4$ (potassium sulfate). The cell voltage was 14.0 volts, the electrode spacing between the workpiece and the electrode was 3.0 mm, and the duty cycle was 20%.

As can be seen from FIG. 3, higher melting solder 34 has been protected by a protective crust 38 while lower melting solder 36 has been attacked during electroetching, resulting in undesirable Sn loss and the consequent compositional change in the solder bump 32. Morevoer, some of the Sn 39 from lower melting solder 36 has been redeposited onto first layer 16 of the seed layer and may even complex with it.

Figure 4:
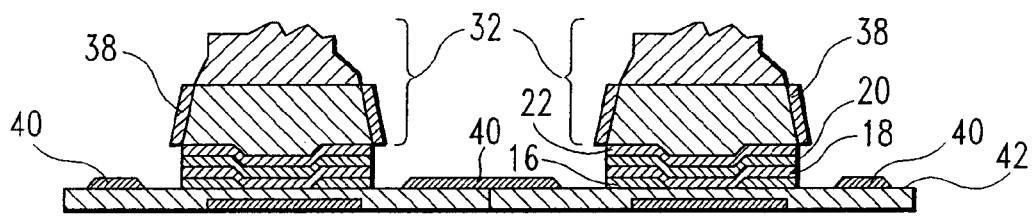
FIG. 4 is a side view of the chip in FIG. 3 after wet etching to remove the last layer of the seed layer.
Figure 5:
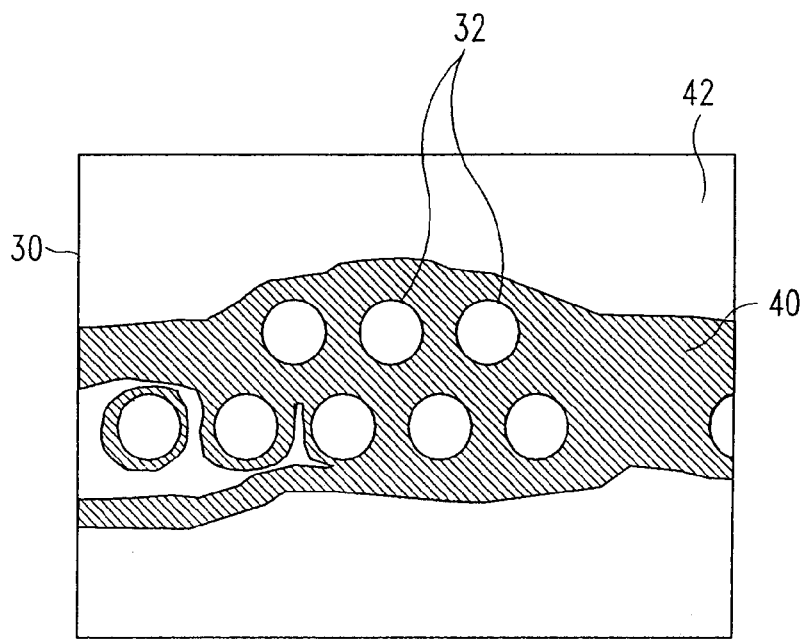
FIG. 5 is an illustration of the surface of the chip in FIG. 4 showing incomplete etching of the seed layer.

Subsequently, second chip 30 was wet etched in a conventional aqueous etchant comprising 30% by weight hydrogen peroxide, 7.8 g/l K-EDTA and 1.1 M potassium sulfate for a period of 330 seconds. The bath temperature was set at 50° C. The results after wet etching are illustrated in FIGS. 4 and 5 where it can be seen that the first layer 16 has been substantially removed leaving surface 42 of the second chip 30 mostly devoid of the first layer 16. On the other hand, Sn deposits 39 (as shown in FIG. 3) prevented the etching of some areas of first layer 16, thereby leaving areas 40 of the first layer 16 which were not etched away.

Chip structures such as that shown in FIGS. 3 to 5 are undesirable and can result in high yield loss. As can be appreciated, any yield loss at this stage of the processing of the chip is very costly.

Figure 6:
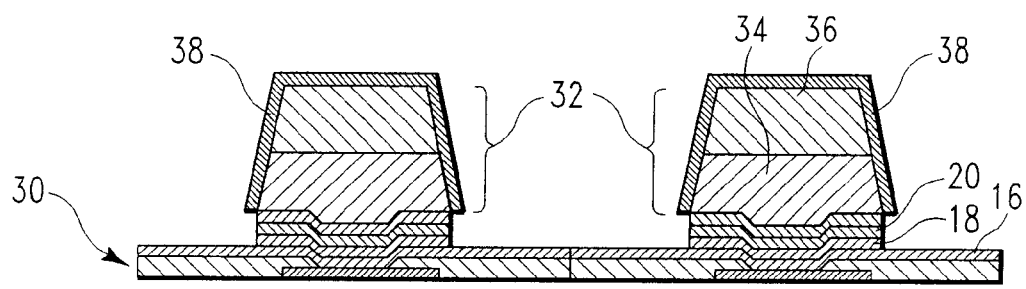
FIG. 6 is a side view of the chip in FIG. 2 after electroetching with the etchant according to the present invention.

Referring now to FIG. 6, second chip 30 was electroetched with an aqueous etchant according to the present invention.

The aqueous electrochemical etchant used for the present invention will have a composition comprising 1.30 to 1.70 M glycerol ($HOCH_2(OH)CH_2OH$) (preferably 1.5 M), 0 to 0.5 M sulfate ion concentration (preferably 0.35 M), and 0.1 to 0.5 M phosphate ion concentration (preferably 0.15 M). The pH should be in the range of 4 to 9 (nominally 5), the cell voltage should be 13 to 17 V (nominally 14.5), the electrode spacing was 3.0 mm, and the duty cycle was 10 to 30% (preferably 20%).

The sulfate ion and phosphate ion may be derived from any salts. Among these are potassium sulfate and potassium phosphate but also sodium sulfate or sodium phosphate could be used for the purposes of the present invention.

The relative amounts of sulfate ion and phosphate ion would be adjusted based on the quantities of high Pb and high Sn solders present. If both high Pb and high Sn solders are present, both sulfate and phosphate ions must be present to protect the solders. If a high Pb solder is not present, the sulfate ions need not be present. As a minimum, the total amount of sulfate ions and phosphate ions must provide a high enough solution conductivity to perform the electroetch at a reasonable voltage.

The metals that may be etched in the presence of the solder bumps include titanium, tungsten, chromium, copper, nickel and alloys thereof. The metals that may be electroetched in the presence of the solder bumps include a variety of metal stacks that include Cu, Cr/Cu, Cu/Ni, and Cr/Cu/Ni alloys.

As an example of one preferred etchant of the present invention, the etchant used to electroetch second chip 30 comprised 1.5 M glycerol, 0.35 M $K_2SO_4$ (potassium sulfate), and 0.15 M $K_3PO_4$ (potassium phosphate). The pH was adjusted to 5.0 using phosphoric acid. The cell voltage was 14.0 volts, the electrode spacing was 3.0 mm, and the duty cycle was 20%. The whole of each of the solder bumps is protected by crust 38. Second and third layers 18, 20 respectively, were removed and no residue is left on the first layer 16.

Figure 7:
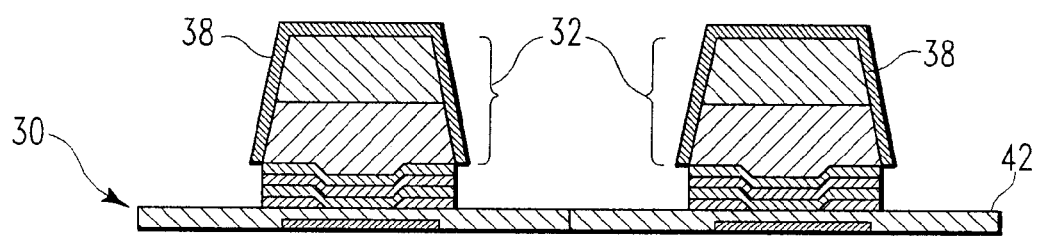
FIG. 7 is a side view of the chip in FIG. 6 after wet etching to remove the last layer of the seed layer.
Figure 8:
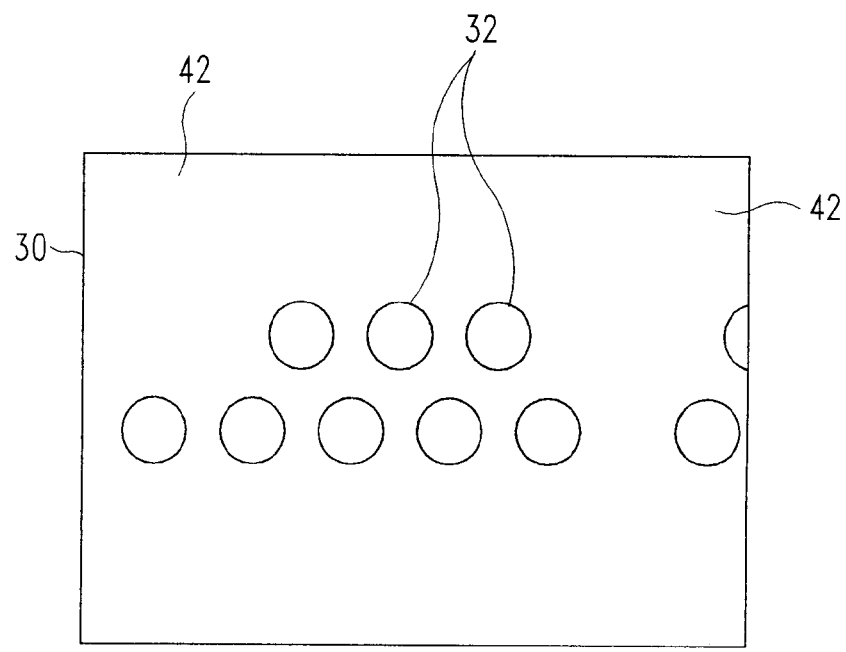
FIG. 8 is an illustration of the surface of the chip in FIG. 7 showing complete etching of the seed layer.

Then, second chip 30 was wet etched in a conventional aqueous etchant comprising 30% by weight hydrogen peroxide, 7.8 g/l K-EDTA and 1.1 M potassium sulfate for a period of 330 seconds. The bath temperature was set at 50° C. The results are illustrated in FIGS. 7 and 8 where it can be seen that the first layer 16 has been entirely removed leaving surface 42 of the second chip 30 devoid of any residue.

Protective crust 38 remains in place after wet etching and is removed with methane sulfonic acid after wet etching is complete.

The use of the present invention has been found to greatly increase the yield from the electroetching process.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

What is claimed is:

1. An aqueous electrochemical etchant for etching metals in the presence of one or more metals not to be etched, the etchant comprising:
   glycerol in the concentration range of 1.30 to 1.70 M;
   a sulfate compound having a sulfate ion concentration in the range of 0 to 0.5 M; and
   a phosphate compound having a phosphate ion concentration in the range of 0.1 to 0.5 M.

2. The electrochemical etchant of claim 1 wherein the pH of the etchant is in the range of 4 to 9.

3. The electrochemical etchant of claim 1 wherein the one or more metals not to be etched are selected from the group consisting of lead, tin and alloys thereof.

4. The electrochemical etchant of claim 1 wherein the one or more metals not be etched are selected from the group consisting of high lead/tin solders having greater than 95 weight percent lead, balance tin; moderate lead/tin solders having less than 40 weight percent lead, balance tin; high tin/low lead solders having greater than 95 weight percent tin, balance lead; no lead solders having tin content greater than 95 weight percent; and combinations thereof.

5. The electrochemical etchant of claim 1 wherein the metals to be etched are selected from the group consisting of chromium, copper, nickel and alloys thereof.

6. The electrochemical etchant of claim 1 wherein the sulfate compound is in the range of 0.2 to 0.5 M.

7. The electrochemical etchant of claim 1 wherein the glycerol concentration is about 1.4 M, the sulfate concentration is about 0.35 M, and the phosphate concentration is about 0.15 M.

8. A method for selectively dissolving, in an article, one or more metals to be dissolved in the presence of one or more metals not to be dissolved, the method comprising the step of:

electrochemically etching the metals to be dissolved with an aqueous etchant comprising glycerol in the concentration range of 1.30 to 1.70 M, a sulfate compound having a sulfate ion concentration in the range of 0 to 0.5 M, and a phosphate compound having a phosphate ion concentration in the range of 0.1 to 0.5 M.

9. The method of claim 8 wherein the pH of the etchant is in the range of 4 to 9.

10. The method of claim 8 wherein the one or more metals not to be etched are selected from the group consisting of lead, tin and alloys thereof.

11. The method of claim 8 wherein the one or more metals not be etched are selected from the group consisting of high lead/tin solders having greater than 95 weight percent lead, balance tin; moderate lead/tin solders having less than 40 weight percent lead, balance tin; high tin/low lead solders having greater than 95 weight percent tin, balance lead; no lead solders having tin content greater than 95 weight percent; and combinations thereof.

12. The method of claim 8 wherein the metals to be etched are selected from the group consisting of chromium, copper, nickel and alloys thereof.

13. The method of claim 8 wherein the sulfate compound is in the range of 0.2 to 0.5 M.

14. The method of claim 8 wherein the glycerol concentration is about 1.4 M, the sulfate concentration is about 0.35 M, and the phosphate concentration is about 0.15 M.

15. A method for selectively etching an article, the method comprising the steps of:

providing an article having one or more metals to be dissolved in the presence of one or more metals not to be dissolved; and electrochemically etching the one or more metals to be dissolved with an aqueous etchant comprising glycerol in the concentration range of 1.30 to 1.70 M, a sulfate compound having a sulfate ion concentration in the range of 0 to 0.5 M, and a phosphate compound having a phosphate ion concentration in the range of 0.1 to 0.5 M.

16. The method of claim 15 wherein the pH of the etchant is in the range of 4 to 9.

17. The method of claim 15 wherein the one or more metals not to be etched are selected from the group consisting of lead, tin and alloys thereof.

18. The method of claim 15 wherein the one or more metals not be etched are selected from the group consisting of high lead/tin solders having greater than 95 weight percent lead, balance tin; moderate lead/tin solders having less than 40 weight percent lead, balance tin; high tin/low lead solders having greater than 95 weight percent tin, balance lead; no lead solders having tin content greater than 95 weight percent; and combinations thereof.

19. The method of claim 15 wherein the metals to be etched are selected from the group consisting of chromium, copper, nickel and alloys thereof.

20. The method of claim 15 wherein the sulfate compound is in the range of 0.2 to 0.5 M.

21. The method of claim 15 wherein the glycerol concentration is about 1.4 M, the sulfate concentration is about 0.35 M, and the phosphate concentration is about 0.15 M.

* * * * *